(12) United States Patent
Miyata et al.

(10) Patent No.: US 7,671,376 B2
(45) Date of Patent: Mar. 2, 2010

(54) LIGHT EMITTING APPARATUS, METHOD OF MANUFACTURING LIGHT EMITTING APPARATUS, AND ELECTRONIC APPARATUS

(75) Inventors: Takashi Miyata, Suwa (JP); Tsukasa Eguchi, Showa-machi (JP); Takahiro Iwashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 479 days.

(21) Appl. No.: 11/468,491

(22) Filed: Aug. 30, 2006

(65) Prior Publication Data
US 2007/0075305 A1    Apr. 5, 2007

(30) Foreign Application Priority Data
Sep. 27, 2005    (JP)    ............................. 2005-279379

(51) Int. Cl.
*H01L 29/207*    (2006.01)
(52) U.S. Cl. .................................. 257/98; 257/E33.068
(58) Field of Classification Search .................... 257/98
See application file for complete search history.

(56) References Cited

U.S. PATENT DOCUMENTS

| 5,559,400 | A  | * | 9/1996 | Nakayama et al. ......... 313/506 |
| 6,911,670 | B2 |   | 6/2005 | Kim et al. |
| 2005/0142976 | A1 |   | 6/2005 | Suzuki |

FOREIGN PATENT DOCUMENTS

| JP | A 2005-197010 | 7/2005 |
| WO | WO 01/39554 A1 | 5/2001 |

* cited by examiner

*Primary Examiner*—Jerome Jackson, Jr.
*Assistant Examiner*—Anthony Ho
(74) *Attorney, Agent, or Firm*—Oliff & Berridge PLC

(57) ABSTRACT

A light emitting apparatus includes first and second unit devices, each including a reflecting layer, a semi-transmitting semi-reflecting layer, a first light emitting layer disposed between the light reflecting layer and the semi-reflecting layer, and a resonator structure. Each resonator structure includes a light transmitting pixel electrode disposed between the corresponding light reflecting layer and semi-reflecting layer. The pixel electrode of the first unit device has more electrode layers than the pixel electrode of the second unit device.

14 Claims, 5 Drawing Sheets

LIGHT EMITTING APPARATUS, METHOD OF MANUFACTURING LIGHT EMITTING APPARATUS, AND ELECTRONIC APPARATUS

BACKGROUND

1. Technical Field

The present invention relates to a light emitting apparatus, a method of manufacturing a light emitting apparatus, and an electronic apparatus.

2. Related Art

In the related art, there is proposed a light emitting apparatus where devices (hereinafter, referred to a unit device) constructed by interposing a light emitting layer made of a light emitting material such as an organic EL (Electro Luminescent) material between first and second electrodes are arrayed on a substrate. In such a light emitting apparatus, since light emitted from the light emitting layer has a wide spectrum peak width and low intensity, there is a problem in that it is difficult to secure sufficient color reproducibility in a case where the light emitting apparatus is used as a display apparatus.

In order to solve the problem, for example, In WO2001039554, disclosed is a construction where resonator structures for resonating the light emitted from the light emitting layer are formed on the unit devices. In the construction, light reflecting layers (dielectric mirrors) are disposed between a first electrode which is disposed on a substrate to faces the light emitting layer and has a light transmitting property and the substrate. The light emitted from the light emitting layer reciprocally moves between the light reflecting layer and a second electrode which are disposed to face each other with the light emitting layer interposed therebetween. Light having a resonance frequency corresponding to an optical distance between the light emitting layer and the second electrode is selectively amplified and output toward an observation side. Therefore, light having a narrow spectrum peak width and high intensity can be used to display an image. As a result, the color reproducibility of a display apparatus can be improved. In addition, by adjusting each optical distance between the light emitting layer and the second electrode for each unit device, light having wavelengths corresponding to a plurality of colors (for example, red, green, and blue) can be obtained.

As an another example of a light emitting apparatus where the resonator structures are formed in the unit devices, proposed is a light emitting apparatus where first electrodes having three different thicknesses corresponding to the colors RGB (red, green, and blue) are formed between the light emitting layer and the second electrode. In general, in such a light emitting apparatus, films for the first electrodes are formed sequentially in the descending order from the thickest film. Until predetermined thicknesses of films are formed on the RGB, a patterning process repeats, so that the first electrodes are formed.

In a case where the first electrodes having predetermined thicknesses corresponding to the RGB is formed by repeating the patterning process, it is determined based on the thicknesses of the required first electrodes whether or not the films formed on the unit devices are to be removed by using an etching process. When first electrodes included in unit devices having a large thickness are patterned, contact holes constituting unit devices including first electrode having a small thickness are exposed to an etchant, so that there may be deterioration in electric characteristics of the light emitting apparatus.

SUMMARY

An advantage of some aspects of the invention is to provide a light emitting apparatus capable of securing stabilized electric characteristics and a method of manufacturing the light emitting apparatus.

According to an aspect of the invention, there is provided a light emitting apparatus having a plurality of unit devices including, on a substrate, a reflecting layer, a semi-transmitting semi-reflecting layer, a light emitting layer disposed between the light reflecting layer and the semi-reflecting layer, and a light transmitting pixel electrode disposed between the light reflecting layer and the semi-reflecting layer, a plurality of the unit devices including light emitting regions provided with resonator structures, so that a plurality of the unit devices include first and second unit devices of which resonance wavelengths of the resonator structures are different from each other, wherein the pixel electrode includes an electrode portion disposed in the light emitting region and a connection portion connected to a wire line, wherein the pixel electrode of each of the first unit devices is constructed by stacking a plurality of electrode layers corresponding to the electrode portion and the connection portion, wherein the pixel electrode of each of the second unit devices is constructed by stacking at least electrode layers corresponding to the electrode layer and the connection layer and an electrode layer corresponding to the connection portion, and wherein the number of the stacked electrode layers in the electrode portion of each of the first unit devices is smaller than the number of the stacked electrode layered in the electrode portion of each of the second unit devices.

In such a light emitting apparatus, if the number of the stacked electrode layers in the electrode portion of each of the first unit devices is smaller than the number of the stacked electrode layered in the electrode portion of each of the second unit devices, when the electrode layers which are to be the pixel electrodes of the first unit devices are formed, the electrode layers corresponding to the electrode portions of the second unit devices may be removed by initial patterning. However, in the light emitting apparatus according to the invention, since the pixel electrode of the second unit device is formed by stacking the electrode layer corresponding to the electrode and connection portions and the electrode layer corresponding to the connection portion, when the electrode layers constituting the pixel electrode constituting the first unit device is patterned, the electrode layer corresponding to the connection portion of the second unit device may not be removed. Therefore, in a process of manufacturing the light emitting apparatus according to the invention, a surface of the substrate corresponding to the connection portion is not exposed to an etchant used for pattering the electrode layer. For example, when a contact hole is formed to expose a wire line on a surface of the substrate corresponding to the connection portion, the contact hole is not exposed to the echant used for pattering the electrode layer. As a result, in the light emitting apparatus according to the invention, it is possible to effectively prevent the etchant used for pattering the electrode layer from deteriorating electrical characteristics of the light emitting apparatus.

In addition, in the light emitting apparatus according to the invention, since the pixel electrode of the second unit device is formed by stacking the electrode layer corresponding to the electrode and connection portions and the electrode layer corresponding to the connection portion, a plurality of the electrode layers are formed on the connection portion of the second unit device. Therefore, reliability in electrical connection between the connection portion and the wire line can be improved, so that it is possible to obtain stabilized electrical characteristics.

On the contrary, in a case where only one electrode layer is formed on the connection portion, the wire line and the pixel electrode may be easily disconnected from each other, so that the reliability in electrical connection between the wire line and the pixel electrode may be lowered.

In addition, the light emitting apparatus according to the invention may further comprise third unit devices of which the number of stacked electrode layers corresponding to the electrode portion is different from those of the first and second unit devices, so that the wavelengths of the resonance structures thereof are different from each other.

According to the light emitting apparatus, light having wavelengths corresponding to RGB can be emitted from the first, second, and third unit devices, so that it is possible to obtain stabilized electrical characteristics. As a result, it is possible to implement a light emitting apparatus having excellent color reproducibility.

In the light emitting apparatus according to the invention, the numbers of stacked electrode layers corresponding to the connection portion may be equal to each other among all the unit devices.

In comparison with an light emitting apparatus including unit devices having different number of stacked layers corresponding to the connection portion, in the according to the light emitting apparatus, electric resistance at the electrical connections between the wire lines and the pixel electrodes becomes uniform, so that it is possible to stabilize electric characteristics of the light emitting apparatus.

In the light emitting apparatus according to the invention, the pixel electrodes may be disposed to cover a step difference portion on the substrate corresponding to the pixel electrodes.

According to the light emitting apparatus, it is possible to effectively preventing deterioration in characteristics of the light emitting apparatus caused from penetration of an etchant used for pattering the electrode layer covering the step difference portion into the substrate corresponding to the electrode layer through the step difference portion existing on the substrate corresponding to the electrode.

In the light emitting apparatus according to the invention, a protective film having a light transmitting property may be disposed to cover the light reflecting layer on an opposite side of the substrate corresponding to the light reflecting layer.

When the etchant used for pattering the electrode layer is attached on the light reflecting layer, a surface of the light reflecting layer may be easily damaged (eroded) Although aluminum, silver, or the like is a suitable material for the light reflecting layer, these material s has low acid resistance, so that these materials may be greatly damaged or deteriorated. In addition, due to the damage to the light reflecting layer, the reflecting characteristics (for example, reflectance) of the light reflecting layer are deteriorated, so that resonance efficiency of the resonator structure is lowered.

However, in the light emitting apparatus according to the invention, the protective film for covering the light reflecting layer is disposed at the opposite side of the substrate corresponding to the light reflecting layer, so that it is possible to effectively prevent the etchant used for patterning the electrode layer from be attached on the light reflecting layer.

According to an aspect of the invention, there is provided a method of manufacturing the aforementioned light emitting apparatus, comprising: forming the first electrode layer corresponding to the electrode and connection portions of the first unit device and corresponding to the connection portion of the second unit device; and forming the second electrode layer corresponding to the electrode and connection portions of the first and second unit devices.

According to the method of manufacturing the light emitting apparatus of the invention, when the first and second electrode layers are patterned, the electrode layers are not etched. In addition, in a process of producing the light emitting apparatus, a surface of the substrate corresponding to the connection portion is not exposed to the etchant used for patterning the electrode layer.

In addition, according to the method of manufacturing the light emitting apparatus of the invention, when the first electrode layer formation process and the second electrode layer formation process are performed, two electrode layers of the first and second electrode layers are formed in the electrode portion of the first unit device, the second electrode layer is formed in the electrode portion of the second unit device, and two electrode layers of the first and second electrode layers are formed in the connection portions of the first and second unit devices. Therefore, according to the method of manufacturing the light emitting apparatus of the invention, the numbers of the electrode layers constituting the electrode portions of the first and second unit devices are formed to be different from each other. In addition, according to the method of manufacturing the light emitting apparatus of the invention, since two electrode layers are formed on the connection portions of the second unit device as well as the first unit device, the electrode layers are not easily disconnected, and reliability in electrical connection between the wire lines and the pixel electrodes are improved.

The method of manufacturing the light emitting apparatus may further comprise: in the forming of the first electrode layer, forming an electrode layer corresponding to the connection portion of the third unit device which is different from the first and second unit devices by using the first electrode layer; in the forming of the second electrode layer, forming an electrode layer corresponding to the connection portion of the third unit device by using the second electrode layer; and after the forming of the second electrode layer, forming a third electrode layer corresponding to the electrode and connection portions of the first, second, and third unit device.

In addition, according to the method of manufacturing the light emitting apparatus of the invention, three electrode layers of the first, second, and third are formed on electrode portion of the first unit device, two electrode layers of the second and third electrode layers are formed on the electrode portion of the second unit device, the third electrode layer is formed on the electrode portion of the third unit device, and three electrode layers of the first, second, and third electrode layers are formed on the connection portion of the third unit device. Therefore, the disconnection of the electrode Layers on the connection portion is accurately prevented, so that the reliability in electrical connection between the wire lines and the pixel electrodes can be greatly improved.

In addition, according to the method of manufacturing the light emitting apparatus, light having wavelengths corresponding to RGB can be emitted from the first, second, and third unit devices, so that it is possible to obtain stabilized electrical characteristics. As a result, it is possible to manufacture a light emitting apparatus having excellent color reproducibility.

The method of manufacturing the light emitting apparatus may further comprise, in the forming of the first electrode layer, forming the first electrode layer to cover a step difference portion on a to-be-formed surface on which the first electrode layer is formed.

According to the method of manufacturing the light emitting apparatus, it is possible to effectively preventing deterioration in characteristics of the light emitting apparatus caused from penetration of an etchant used for pattering the electrode layer into the substrate corresponding to the electrode layer through the step difference portion existing on a to-be-formed surface where the first electrode layer is formed.

The method of manufacturing the light emitting apparatus may further comprise forming the second electrode layer to cover a portion of the first electrode layer corresponding to the step difference portion.

According to the method of manufacturing the light emitting apparatus, it is possible to effectively preventing penetration of the etchant I in comparison with a case where the step difference portion on a to-be-formed surface is covered with only the first electrode layer.

The method of manufacturing the light emitting apparatus may further comprise, before the forming of the electrode, forming the light reflecting layer and forming a protective film having a light transmitting property to cover the light reflecting layer.

According to the method, it is possible to prevent etchant used for pattering the electrode layers from being attached on the light reflecting layer.

According to still another aspect of the invention, there is provided an electronic apparatus comprising any one of the aforementioned light emitting apparatuses.

According to the electronic apparatus, the electronic apparatus can include a light emitting apparatus capable of obtaining high reliability in electrical connection between the wire lines and the pixel electrodes and stabilized electrical characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
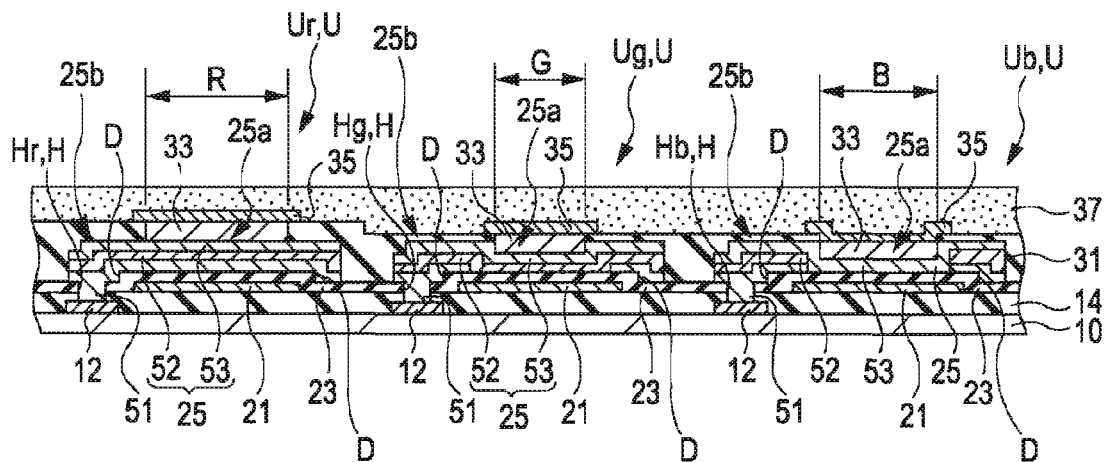
FIG. 1 is a cross-sectional view showing a construction of a light emitting apparatus according to a first embodiment of the invention.

Hereinafter, a light emitting apparatus according to the invention will be described by exemplifying an EL apparatus. In the later description, various structures are exemplified by using drawings. In the structure shown in the drawings, sizes of specific elements or portions may be shown differently from those of actual structures for the better understanding thereof.

Light Emitting Apparatus

Firstly, an EL apparatus will be described as a light emitting apparatus according to an embodiment.

FIG. 1 is a cross-sectional view showing a construction of the EL apparatus according to the embodiment. As shown in FIG. 1, the EL apparatus is constructed by sealing a plurality of unit devices U (Ur, Ug, and Ub) disposed in matrix on a substrate 10 with a sealing member 37. Each of the unit devices U is an element which generates light having a wavelength corresponding to one of colors, that is, red, green, and blue. Resonator structures in the unit devices U generate different resonance wavelengths. Namely, the unit device Ur (first unit device) emits red light, the unit device Ug (second unit device) emits green lights and the unit device Ub (third unit device) emits blue light.

The EL apparatus according to the embodiment is a top emission type EL apparatus where light generated by the unit devices U is emitted toward an opposite side of the substrate 10. Therefore, the substrate 10 may be constructed with a light transmitting plate member such as glass or other opaque plate members such as metal sheet.

As shown in FIG. 1, a plurality of wire lines 12 are disposed on a surface of the substrate 10. The wire lines 12 includes, for example, data lines and scan lines which are used to transmit signals for driving the unit devices U.

The surface of the substrate 10 on which the wire lines 12 are disposed is covered with a base layer 14. The base layer 14 is a film made of a resin material such as an acrylic resin and an epoxy resin, an inorganic material such as a silicon oxide (SiOx) and a silicon nitride (SiNx), or other various insulating materials.

Light reflecting layers 21 are formed on a surface of the base layer 14 so as to correspond to the unit devices U. In the embodiment, the light reflecting layers 21 are arrayed in stripe according the array of the unit devices U. The light reflecting layers 21 are made of a material having a light reflecting property. More specifically, the light reflecting layers 21 may be made of a single-body metal such as aluminum and silver, an alloy containing aluminum or sliver as a main component, or other various materials.

A surface of the baser layer 14 on which the light reflecting layers 21 are disposed is covered with a protective film 23 which is continuously distributed over a plurality of the unit devices U. The protective film 23 prevents an etchant used for patterning a later-described electrode layer from attaching on the light reflecting layers 21 so as to protect the light reflecting layers 21. The protective film 23 is made of a silicon oxide (SiOx), a silicon nitride (SiNx), or other insulating materials having a light transmitting property.

As shown in FIG. 1, in the unit devices U, contact holes H (Hr, Hg, and Hb) are formed to pass through the protective film 23 and the base layer 14 in thickness direction at positions where overlap the wire lines 12 as seen in a vertical direction of the surface of the substrate 10. Namely, the contact hole Hr is formed in the unit device Ur which emits red light, the contact hole Hg is formed in the unit device Ug which emits green light, and the contact hole Hb is formed in the unit device Ub which emits blue light.

First electrodes 25 (pixel electrodes) are formed on a surface of the substrate 10 on which the protective film 23 is formed. Each of the first electrodes 25 includes an electrode portion 25a which is disposed on each emitting region RGB overlapping light emitting members 33 as seen in a plan view and a connection portion 25b which is disposed on each contact hole H to be connected to a charge transferring wire line connected to an external portion through each contact hole H. As shown in FIG. 1, the first electrodes 25 are formed so as to cover step difference portions D in the first electrodes 25 on the substrate 10 and to be separated from each other in the unit devices U. In the embodiment, the numbers of stacked electrode layers of the electrode portions 25a are different according to colors of light emitted form the unit devices U.

More specifically, on the surface of the substrate 10 on which the protective film 23, a first electrode layer 51 is formed so as to cover the contact H the light reflecting layer 21 of the unit device Ur which emits red light among the unit devices U. A second electrode layer 52 is formed so as to cover a first electrode layer forming region where the first electrode layer 51 is formed and the light reflecting layer 21 of the unit device Ug which emits green light, and a third electrode layer 53 is formed so as to cover a second electrode layer forming region where the second electrode layer 52 is formed and the light reflecting layer 21 of the unit device Ub which emits blue light. The first electrode layer 51, the second electrode layer 52, and the third electrode layer 53 are made of ITO (Indium Tin Oxide), IZO (Indium Zinc Oxide), or other light transmitting conductive materials.

Therefore, as shown in FIG. 1, the first electrode 25 of the unit device Ur for emitting red light is constructed by stacking three electrode layers of the first, second, and third electrode layers 51, 52, and 53 corresponding to the electrode portion 25a and the connection portion 25b. The first electrode 25 of the unit device Ug for emitting green light is constructed by stacking the first electrode layer 51 corresponding to the connection portion 25b and two layers of the second and third electrode layers 52 and 53 corresponding to the electrode portion 25a and the connection portion 25b. The first electrode 25 of the unit device Ub for emitting blue light is constructed by stacking two layers of the first and second electrode layers 51 and 52 corresponding to the connection portion 25b and the third electrode layer 53 corresponding to the electrode portion 25a and the connection portion 25b.

As shown in FIG. 1, on each of the contact holes H, all the electrodes constituting the first electrode 25, that is, the first, second, and third electrode layers 51, 52, and 53 are stacked, and among all the unit devices U, the numbers of the stacked electrode layers corresponding to the connection portion 25b of the first electrode 25 are equal to each other. In addition, the first electrode layer 51 is formed to be inserted into the contact hole H and connected to the wire line 12. The first, second, and third electrode layers 51, 52, and 53 are electrically connected to the wire lines 12.

A partition wall layer 31 is formed on the surface of the substrate 10 on which the first electrode 25 is formed. The partition wall layer 31 is formed as a partition wall in a shape of grid so as to partition a space on the surface of the substrate 10 into regions for the unit devices U. The partition wall layer 31 is made of a resin material such as an acrylic resin and an epoxy resin, an inorganic material such as a silicon oxide and a silicon nitride, or other various insulating materials.

The light emitting members 33 corresponding to the unit devices U are formed in spaces defined by inner walls of the partition wall layer 31 and bottom surfaces of the first electrode electrodes 25. The light emitting members 33 have a structure formed by stacking a plurality of functional layers including a light emitting layer made of an organic EL material. The light emitting member 33 of each unit device U includes a light emitting layer for emitting light having a wavelength corresponding to the associated unit device U. The first electrode 25 of each unit device U functions as a positive electrode for applying electric energy to the light emitting member 33. The second electrode 35 functioning as a negative electrode of the light emitting member 33 is formed on a surface of the light emitting member 33. Alternatively, the first and second electrodes 25 and 35 may be constructed to function as negative and positive electrodes, respectively.

In the embodiment, the light emitting member 33 has a structure formed by stacking three type functional layers of a hole transport layer, a light emitting layer, and an electron transport layer sequentially in this order in a direction of from the substrate 10 to the second electrode 35. The light emitting member 33 is not limited to the exemplified structure. For example, an hole injection layer may be interposed between the hole transport layer and the first electrode 25. In addition, an electron injection layer may be interposed between the electron transport layer and the second electrode 5. In other words, any structure where the light emitting layer is interposed between the first and second electrodes 25 and 35 may be employed.

The second electrode 35 (semi-transmitting semi-reflecting layer) functions as a semi-transmitting semi-reflecting layer which transmits a portion of light incident on a surface thereof and reflects the other portion of the light. In the embodiment, the second electrode 35 is made of ITO (Indium Tin Oxide) or other materials having a light transmitting property. In a case where the second electrode 35 is made of a light transmitting material, if a sealing member 37 is made of a material having a refractive index lower than that of the second electrode 35, a portion of light is transmitted and the other portion of the light is reflected on an interface between the second electrode 35 and the sealing member 3. Therefore, in this case, the second electrode 35 can function as a semi-transmitting semi-reflecting layer. In addition, even in a case where the second electrode 35 is constructed with a thin member made of aluminum, silver, an alloy containing aluminum or silver as a main component, or other light emitting materials, the second electrode 35 can function as a semi-transmitting semi-reflecting layer.

Each of the unit devices U includes the light reflecting layer 21, the first electrode 25, the light emitting member, and the second electrode 35 Each of the unit devices U is provided with a resonator structure which resonates light emitted from the light emitting layer between the light reflecting layer 21 and the second electrode 35. More specifically, the light emitted from the light emitting layer of the light emitting member 33 reciprocally moves between the light reflecting layer 21 and the second electrode 35, so that only a component having a resonance wavelength of the resonator structure is amplified. The amplified component is emitted through the second electrode 35 toward the observation side (upper portion of FIG. 1). Therefore, according to the embodiment, light having a narrow spectrum peak and a high intensity can be used to display an image.

For example, assuming that the refractive indexes and thicknesses of the light emitting members 33 are substantially equal to each other irrespective of colors of light emitted from the unit devices U, the resonance wavelength is defined according to an optical distance between a surface of the light reflecting layer 21 facing the light emitting member 33 and a surface of the light emitting member 33 facing the light reflecting layer 21. In addition, in the embodiment, the optical distance between the light reflecting layer 21 and the light emitting member 33 is defined individually for the colors of light emitted from the unit devices U according to thickness of the first electrode 25, that is, the number of stacked electrode layers, as described later.

As described above with reference to FIG. 1, in the red unit device Ur, the first, second, and third electrode layers 51, 52, and 53 of the first electrode 25 and the protective film 23 are interposed between the light reflecting layer 21 and the light emitting member 33. In the green unit device Ug, the second and third electrodes 52 and 53 of the first electrode 25 and the protective film 23 are interposed between the light reflecting layer 21 and the light emitting member 33. In the blue unit device Ub, the third electrode layer 53 of the first electrode 25 and the Protective film 23 are Interposed between the light reflecting layer 21 and the light emitting member 33.

In a case where the first electrode 25 is made of ITO (IndIum Tin oxide) and the protective film 23 is made of a silicon nitride having a refractive index substantially equal to that of the first electrode 25, the optical distance between the light reflecting layer 21 and the light emitting member 33 is proportional to a geometrical distance therebetween. In other words, in the embodiment, the resonance wavelength of the unit device Ur is longer than that of the unit device Ug, and the resonance wavelength of the unit device Ug is longer than that of the unit device Ub. In this state, the resonator structures of the unit devices U are defined by the thickness of the first electrode 25 and the thickness of the protective film 23.

Method of Manufacturing Light Emitting Apparatus

Now, a method of manufacturing the EL apparatus according to the embodiment shown in FIG. 1 is described with reference to FIGS. 2 to 11. Later-described layers may be formed by using a disposition process such as a sputtering process and a CVD (Chemical Vapor Disposition) or other various known film-forming processes. In addition, patterning of layers may be performed by using a photolithography technique, an etching technique, or others.

Figure 2:
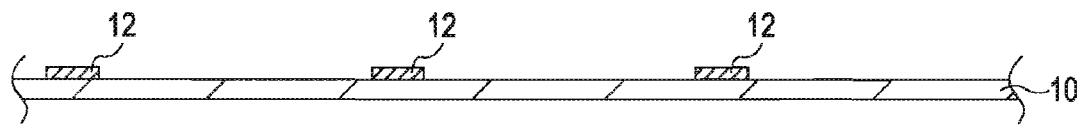
FIG. 2 is a view for explaining a process of a method of manufacturing the light emitting apparatus shown in FIG. 1.
Figure 3:
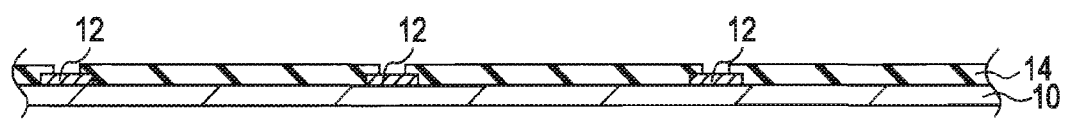
FIG. 3 is a view for explaining a process of the method of manufacturing the light emitting apparatus shown in FIG. 1.
Figure 4:
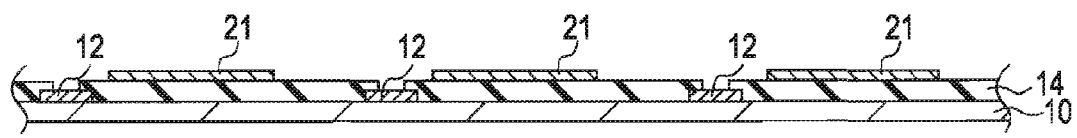
FIG. 4 is a view for explaining a process of the method of manufacturing the light emitting apparatus shown in FIG. 1.
Figure 14:
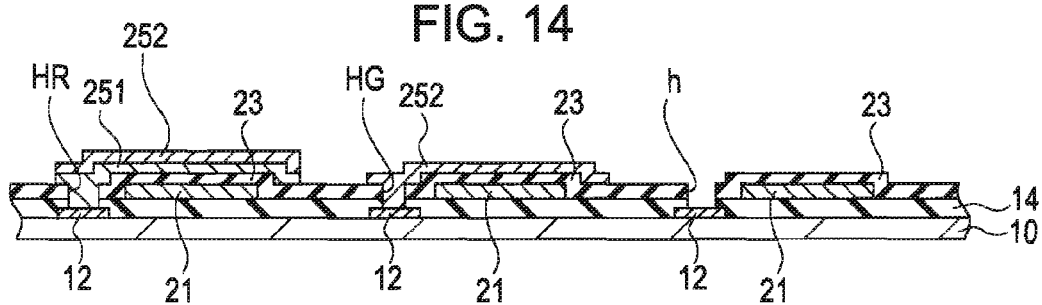
FIG. 14 is a view for explaining a process of the method of manufacturing the light emitting apparatus shown in FIG. 12.

Firstly, as shown in FIG. 2, a plurality of the wire lines 12 are formed at predetermined positions on the surface of the substrate 10. Subsequently, a layer to be formed as the base layer 14 is formed over the entire surface of the substrate 10 and patterned, so that the base layer 14 shown in FIG. 14 is formed as shown in FIG. 3. Next, a light transmitting conductive film is formed over the entire surface of the substrate 10, and the conductive film is patterned, so that the light reflecting layer 21 is formed as shown in FIG. 4.

Figure 5:
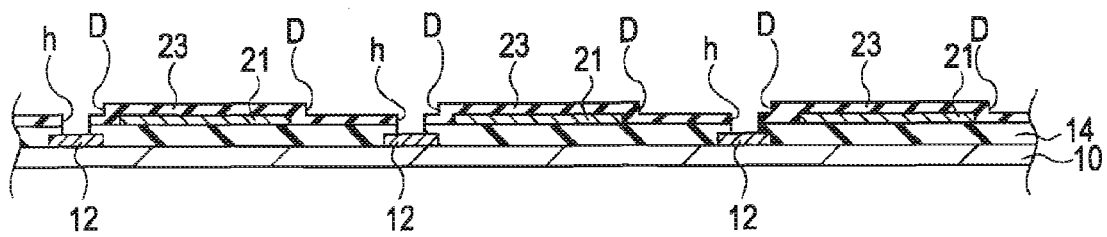
FIG. 5 is a view for explaining a process of the method of manufacturing the light emitting apparatus shown in FIG. 1.

Next, an insulating film having a light transmitting property is formed over the entire surface of the substrate 10, and the insulating film is patterned, so that the protective film is formed to cover the light reflecting layer 21 (protective film formation process) as shown in FIG. 5. On the formed protective film 23, a step difference portion D is formed in a region covering an edge of the light reflecting layer 21 due to the thickness of the light reflecting layer 21. In addition, in the embodiment, as shown in FIG. 5, in the protective film formation process, portions of the insulating film overlapping the wire lines are removed to form holes H exposing the wire lines which are to be the contact holes H.

Figure 6:
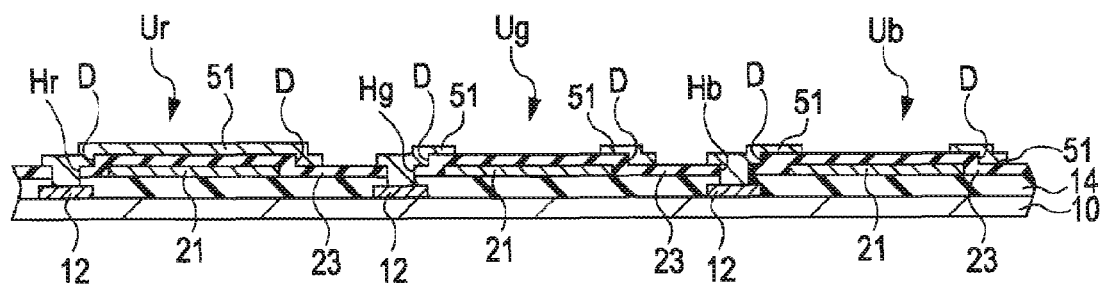
FIG. 6 is a view for explaining a process of the method of manufacturing the light emitting apparatus shown in FIG. 1.

Next, the first electrodes 25 (pixel electrode) are formed on the light reflecting layers. Firstly, a conductive film which is to be the first electrode layer 51 of the first electrodes 25 is formed over the entire surface of the substrate 10. All the holes h which are to be the contact holes H are filled with a material for the conductive film, so that the contact holes H passing through the first electrode layer 51 and the wire lines 12 are formed. Next, a conductive film which is to be the first electrode layer 51 is patterned, so that the first electrode layer 51 is formed to cover the entire top portion of the contact hole H, the light reflecting layer 21 of the unit device Ur emitting red light among the unit device U, and the step difference portions D on the protective film 23 (to-be-formed surface) which is to be a underlying layer of the first electrode layer 51 as shown in FIG. 6 (first electrode layer formation process). In the first electrode layer formation process, as shown in FIG. 6 the first electrode layer 51 is formed to correspond to the electrode portion 25a and the connection portion 25b of the unit device Ur emitting red light among the unit devices U and to correspond to the connection portion 25b of the unit device Ub emitting blue light among the unit devices U.

Figure 7:
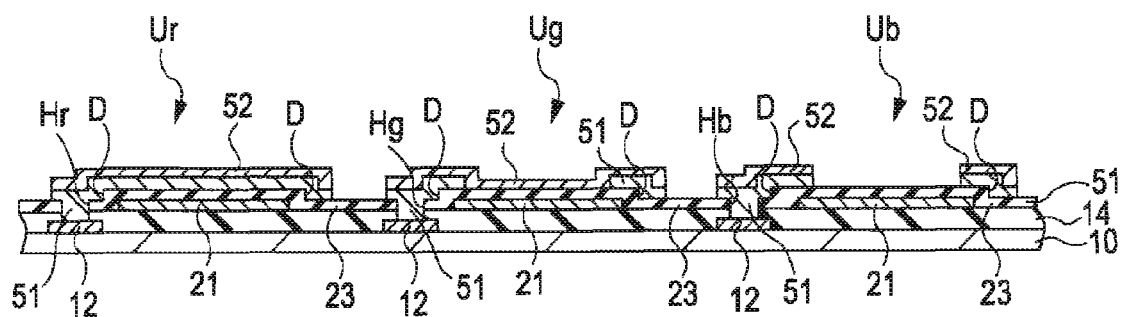
FIG. 7 is a view for explaining a process of the method of manufacturing the light emitting apparatus shown in FIG. 1.

Next, a conductive film which is to be the second electrode layer 52 of the first electrode 25 is formed over the entire surface of the substrate 10, and the conductive film is patterned, so that the second electrode layer 52 is formed to cover the first electrode layer forming region on which the first electrode layer 51 is formed and the light reflecting layer 21 of the unit device Ug emitting green light as shown in FIG. 7 (second electrode layer formation process). Therefore, in the second electrode layer formation process, as shown in FIG. 7, the second electrode layer 52 is formed on the first electrode layer 51 corresponding to the electrode portions 25a and the connection portions 25b of the unit device Ur emitting red light and the unit device Ug emitting green light and corresponding to the connection portion 25b of the unit device Ub emitting blue light and the step difference portion D.

Figure 8:
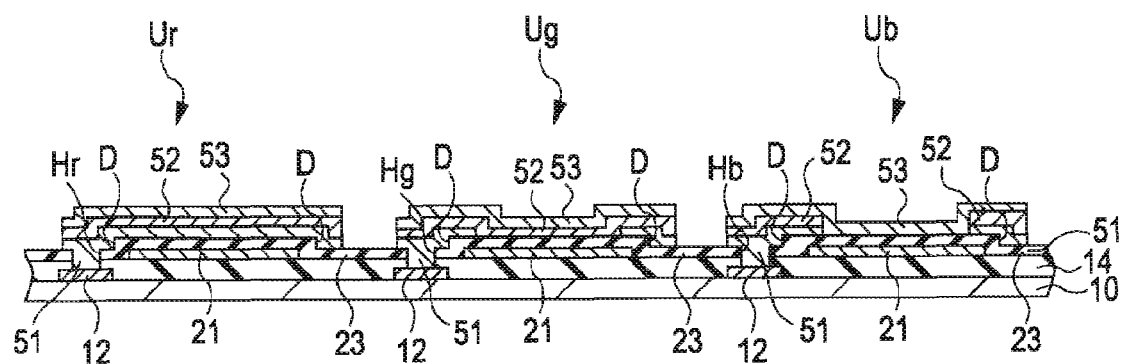
FIG. 8 is a view for explaining a process of the method of manufacturing the light emitting apparatus shown in FIG. 1.

Subsequently, a conductive film which is to be the third electrode layer 53 of the first electrode 25 is formed over the entire surface of the substrate 10, so that the third electrode layer 53 is formed to cover the second electrode layer forming region on which the second electrode layer 52 is formed and the light reflecting layer 21 of the unit device Ub emitting blue light as shown in FIG. 8 (third electrode layer formation process). Therefore, in the third electrode layer formation process, as shown in FIG. 8, the third electrode layer 53 corresponding to the electrode portions 25a and the connection portions 25b of all the unit devices U is formed.

Figure 9:
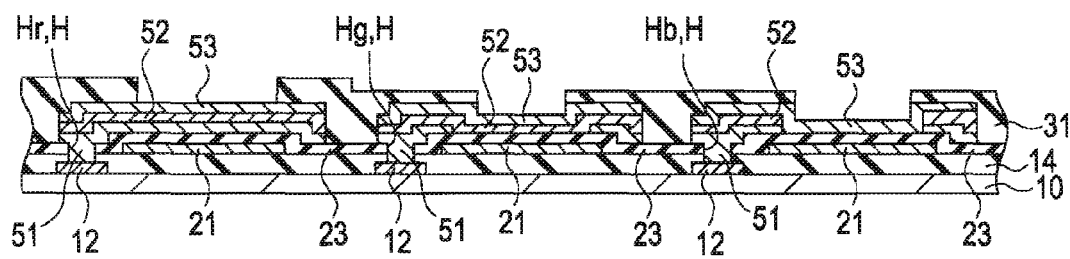
FIG. 9 is a view for explaining a process of the method of manufacturing the light emitting apparatus shown in FIG. 1.
Figure 10:
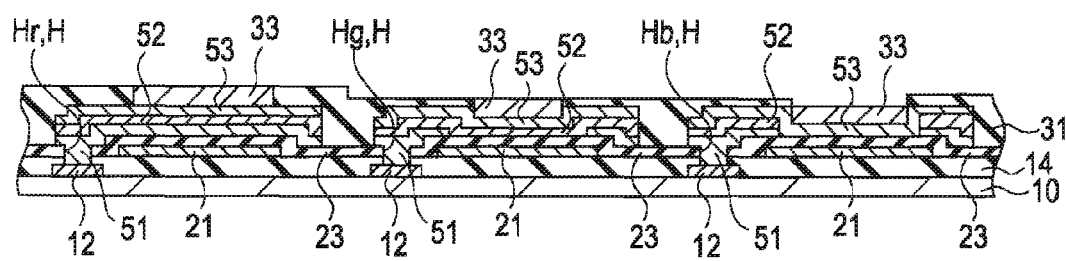
FIG. 10 is a view for explaining a process of the method of manufacturing the light emitting apparatus shown in FIG. 1.
Figure 11:
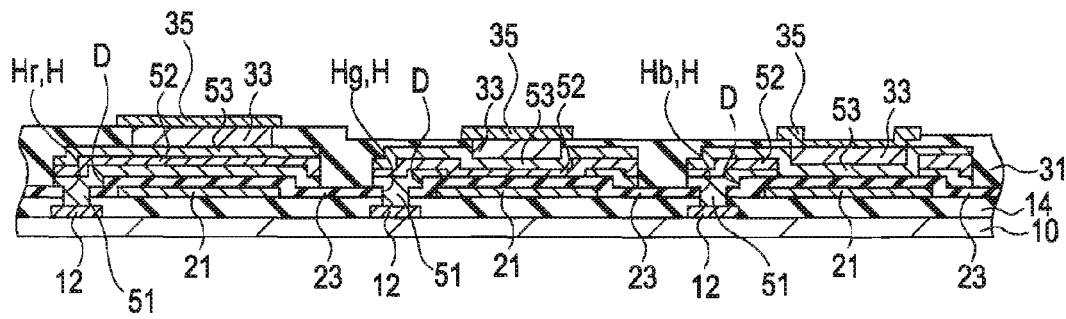
FIG. 11 is a view for explaining a process of the method of manufacturing the light emitting apparatus shown in FIG. 1.

Subsequently, a resin film is formed and patterned, so that the partition wall layer 31 is formed as shown in FIG. 9. Next, as shown in FIG. 10, the light emitting members 33 including the light emitting layers corresponding to colors of the light emitted from the unit devices U are sequentially formed in the spaces for the unit devices U partitioned by the partition wall layer 31. Next, as shown in FIG. 11, the second electrode 35 having a semi-transmitting semi-reflecting property is formed to face the first electrode 25 with the light-emitting members 33 interposed therebetween, and after that, the sealing member i.s disposed to cover the entire surface of the substrate 10 (see FIG. 1).

Now, advantages f the aforementioned EL apparatus according to the embodiment are described in detail ILn comparison with a comparative example.

Figure 12:
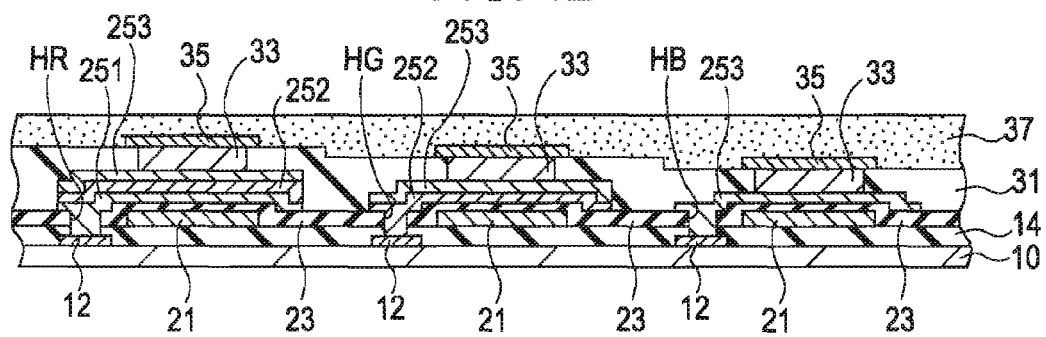
FIG. 12 is a cross-sectional view showing a construction of a light emitting apparatus according to a comparative example.
Figure 13:
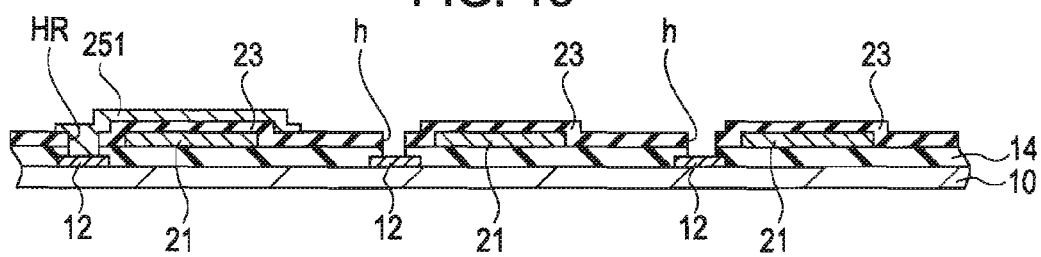
FIG. 13 is a view for explaining a process of a method of manufacturing the light emitting apparatus shown in FIG. 12.
Figure 15:
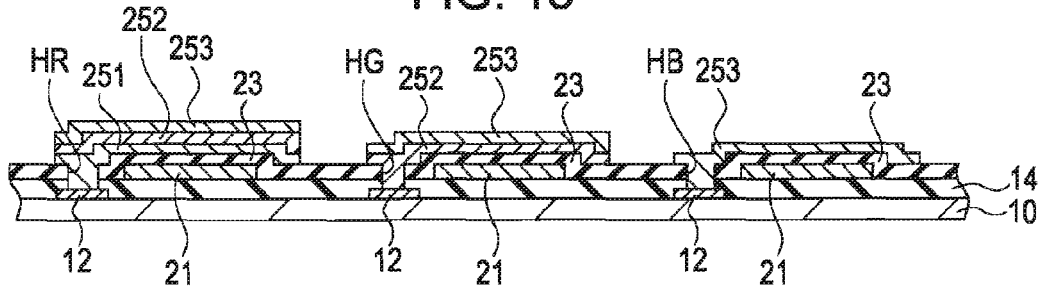
FIG. 15 is a view for explaining a process of the method of manufacturing the light emitting apparatus shown in FIG. 12.

FIG. 12 shows an EL apparatus according to the comparative example. FIGS. 13 to 15 are views for explaining a series of processes of a method of manufacturing the EL apparatus shown in FIG. 12. Similarly to the EL apparatus shown in FIG. 1, the EL apparatus shown in FIG. 12 is constructed by covering the light reflecting layers 21 of all the unit devices U with a single protective film 23 and after that, individually defining the thicknesses of the first electrodes 25, that is, the number of electrode layers thereof according to colors of light emitted from the unit devices U.

The differences between the EL apparatus shown in FIG. 12 and the EL apparatus shown in FIG. 1 are as follows. In the EL apparatus shown in FIG. 1, all the electrode layers constituting the first electrode 25 are formed on all the contact holes H. However, in the EL shown in FIG. 12, only a portion of the electrode layers constituting the first electrode are formed on the contact holes HG of the unit device Ug emitting green light and the contact hole HE of the unit device Ub emitting blue light. More specifically, similarly to the light reflecting layer 21, only the two electrode layers of the second and third electrode layers 252 and 253 among the three electrode layers of the first, second, and third electrode layers of the first electrode are formed on the contact hole HG of the unit device Ug emitting green light In addition, similarly to the light reflecting layer 21, only the one electrode layer of the third electrode layer 253 is formed on the contact hole HE of the unit device Ub emitting blue light.

In the method of manufacturing the EL apparatus shown in FIG. 12, only the process for forming the first electrode is different from the processes of the method of manufacturing the EL apparatus shown in FIG. 1. Therefore, the later description is made on the process for forming the first electrode.

Firstly, a conductive film which is to be the first electrode layer 251 of the first electrode is formed on the entire surface of the substrate 10 shown in FIG. 5. The holes h which are to be all the contact holes H are filled with a material for the conductive film. The conductive film which is to be the first electrode layer 251 is patterned, so that the first electrode layer 251 is formed to cover only the contacts hole HR of the unit device Ur emitting red light and the light reflecting layer 21 of the unit device Ur as shown in FIG. 13.

Next, a conductive film which is to be the second electrode layer 252 of the first electrode is formed over the entire surface of the substrate 10. The holes h which are to be the contact holes HG and HB are filled with a material for the conductive film. The conductive film is patterned, so that the second electrode layer 252 is formed to cover the first electrode layer forming regions on which the first electrode layer 251 is formed, and the contact hole HG of the unit device Ug, and the light reflecting layer 21 of the unit device Ug as shown in FIG. 14.

Subsequently, a conductive film which is to be the third electrode layer 253 of the first electrode is formed over the entire surface of the substrate 10, and the conductive film is patterned, so that the third electrode layer 253 is formed to cover the second electrode layer forming region on which the second electrode layer 252 is formed, and the contact hole HB of the unit device Ub emitting blue light, and the light reflecting layer 21 of the unit device Ub as shown in FIG. 15.

In case of manufacturing the EL apparatus shown in FIG. 12 by using the aforementioned method, in the process for forming the first electrode layer 251, the conductive film which is to be the first electrode layer 251 filling the holes h which are to be contact holes H of the unit devices Ug and Ub emitting green and blue light, respectively, is removed by patterning. The inner portions of the holes h which are to be contact holes HG and HB are exposed to an etchant used for patterning the conductive film which is to be the first electrode layer 251.

In addition, in the process for forming the second electrode layer 252, the conductive film which is to be the second electrode layer 252 filling the holes h which are to be the contact hole HB of the unit device Ub emitting blue light, respectively, is removed by patterning. The inner portion of the hole h which is to be the contact hole HB is also exposed to an etchant used for patterning the conductive film which is to be the second electrode layer 252.

On the contrary, in case of manufacturing the EL apparatus shown in FIG. 1, in the aforementioned first electrode layer formation process, the conductive film which is to be the first electrode layer 51 formed on the contact hole H cannot be removed by patterning. For the reason, the hole h which is to be the contact hole H cannot be exposed to the etchant used for pattering the conductive film which is to be the first electrode layer 51.

In addition, in case of manufacturing the EL apparatus shown in FIG. 1, in the first electrode layer formation process, the first electrode layer 51 is formed to correspond to the connection portions 25b of all the unit devices U, so that the inner portions of the all the contact holes H are filled with a material for the conductive film which is to be the first electrode layer 51. In not only the first electrode layer formation process but also the second and third electrode layer formation processes, the holes h which are to be the contact holes H cannot be exposed to the etchant used for pattering. Therefore, according to the embodiment, it is possible to effectively prevent deterioration of the contact holes H caused from the etchant attached thereon during the formation of the first electrode 25.

In addition, in comparison with a case where the unit devices of the light emitting apparatus include unit devices having different numbers of electrode layers stacked on the contact holes like the EL apparatus shown in FIG. 12 where electrode layers with the same number as that of the light emitting region are stacked on each of the contact holes, in the EL apparatus according to the embodiment, since all the electrode layers constituting the first electrode 25 are stacked on the contact holes H, electric resistance at the electrical connections between the wire lines 12 and the first electrodes 25 becomes uniform, so that it is possible to stabilize electric characteristics of the EL apparatus.

In addition, in comparison with the contact holes H of the unit devices U in the EL apparatus shown in FIG. 1, in case of the EL apparatus shown in FIG. 12, only one electrode layer of the third electrode layer 253 is formed on the hole HB of the unit device Ub emitting blue light. In this case, the electrode layers on the contact holes H may be easily disconnected, so that reliability of electrical connection between the wire lines 12 and the first electrodes through the contact holes H is lowered.

In addition, according to the embodiment, in the first electrode layer formation process, the light reflecting layer 21 is covered with the protective film 23. Therefore, when the conductive film which is to be the first electrode layer 51 which overlaps the light reflecting layers of the unit device Ug emitting green light and the unit device Ub emitting blue light as seen in a plan view is removed, the etchant cannot be attached on the light reflecting layers 21 of the unit devices Ug and Ub. In addition, according to the embodiment, since the light reflecting layer 21 is covered with the protective film 23, in the second electrode layer formation process, when the conductive film which is to be the second electrode layer 52 which overlaps the light reflecting layer 21 of the unit device Ub emitting blue light as seen in a plan view is removed, the etchant cannot be attached on the light reflecting layer 21 of the unit device Ub. As a result, it is possible to effectively prevent deterioration of the light reflecting layer 21 caused from the etchant used for the first and second layer formation processes.

In addition, in a case where the protective film 23 for covering the light reflecting layer 21 is disposed, the step difference portion D formed on the protective film 23 may be easily damaged, so that the etchant used for pattering the first electrode 25 penetrates to deteriorate the light reflecting layer 21. However, according to the embodiment, since the first electrode layer 51 is formed to cover the step difference d on the protective film 23, the defects involved with the step difference portion of the protective film 23 an be prevented. As a result, it is possible to more effectively prevent deterioration in characteristics of the EL apparatus.

MODIFIED EXAMPLES

The aforementioned embodiment may be modified in various manners. The examples of the modifications are as follows. In addition, the examples may be used in combination thereof.

(1) Although the protective film 23 is formed to cover the light reflecting layer 21 in the aforementioned embodiment, the protective film 23 may not be employed.

(2) Although the elements constituting the unit devices U corresponding to colors of emitted light are formed to be separated from each other in the aforementioned embodiment, the elements may be formed continuously over the unit devices corresponding to the colors of emitted light. For example, at least one functional layer of the light emitting members 33 or the second electrode 35 may be continuously distributed over all the unit devices U. Although the light emitting layer is continuously formed over all the unit devices, the unit devices U can emit light in different colors by suitably selecting the resonance wavelengths of the unit devices U. In addition, the light reflecting layer 21 in the first embodiment may be continuously distributed over all the unit devices U.

(3) Although the second electrode 35 also functions as a semi-transmitting semi-reflecting layer of the resonator in the aforementioned embodiment, the semi-transmitting semi-reflecting layer in separation from the second electrode 35 may be employed. In such a construction, the semi-transmitting semi-reflecting layer may be disposed at the light emitting member 33 rather than the second electrode 35 or at the opposite side thereof (observation side).

(4) In the aforementioned embodiment, color filters of colors (red, green, and blue) corresponding to the colors of light emitted from the unit devices U may be employed. As an example of the color filter, there are color filters corresponding to colors which are formed on a plate member having a light transmitting property. The color filters corresponding to the unit devices U have a function of selectively transmitting light having wavelengths corresponding to the resonance wavelengths of the unit devices U. For example, an observation side of the red unit device Ur is provided with a color filer for transmitting red light. According to such a construction, only components transmitting the color filers among the light emitted from the unit devices U can be emitted toward the observation side, it is possible to further improve color reproducibility in comparison with a case where the color filters are not provided. In addition, since external light is absorbed by the color filter, it is possible to reduce reflection of the external light.

(5) Materials for elements constituting the light emitting apparatus or a method of producing the elements may be arbitrarily modified. For example, although the light emitting layer made of an organic EL material is employed in the embodiment, the invention may be applied to a light emitting apparatus including a light emitting layer made of an inorganic EL material or a light emitting apparatus using a light emitting diode as a light emitting member.

Electronic Apparatus

Next, an electronic apparatus using the light emitting apparatus according to the invention is described.

Figure 16:
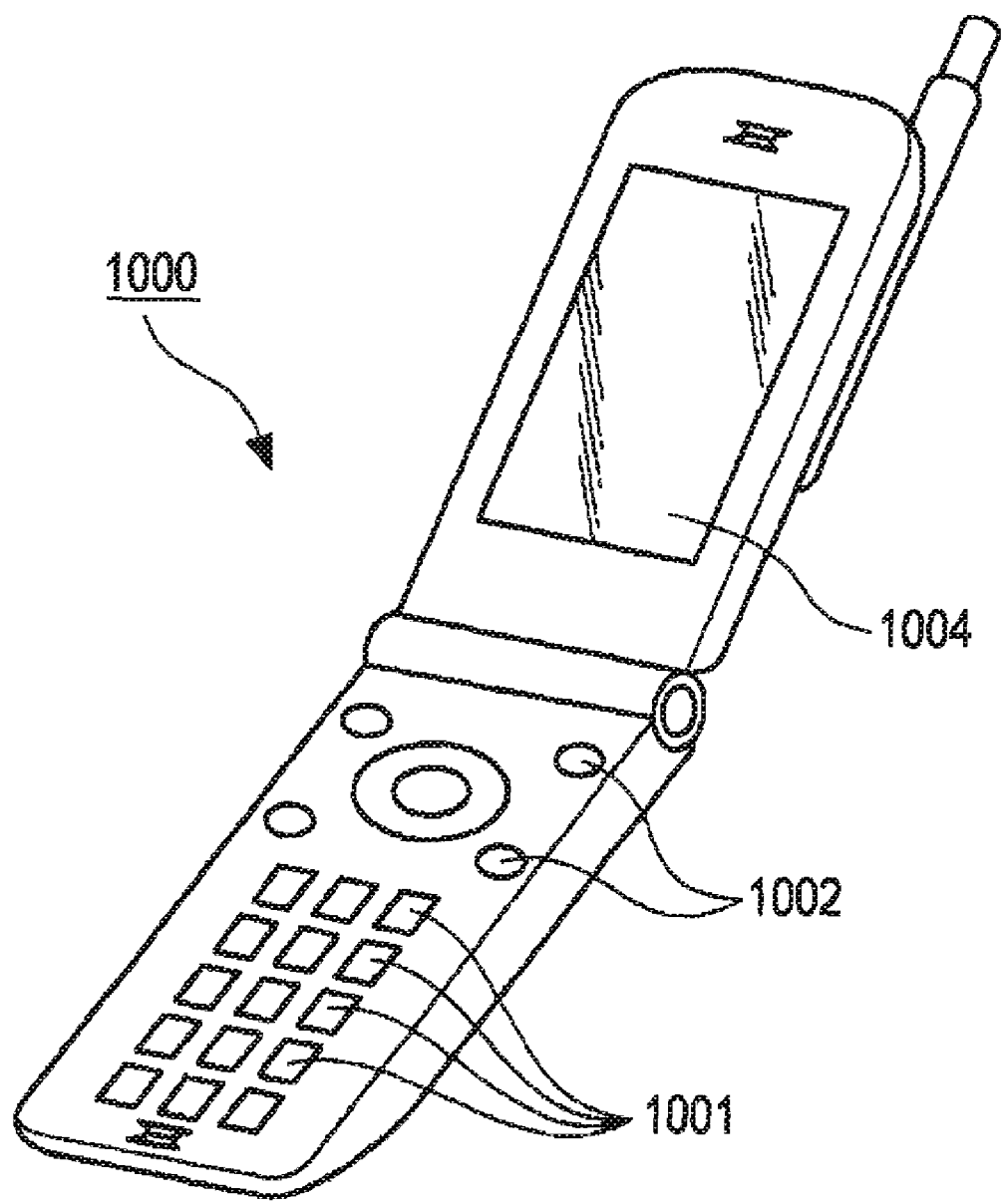
FIG. 16 is a perspective view showing an example of an electronic apparatus according to the invention.

FIG. 16 show a construction of a mobile phone using the EL apparatus shown in FIG. 1 as a display apparatus. The mobile phone 1000 includes a plurality of manipulation buttons 1001, a scroll button 1002, and the EL apparatus 1004 as a display apparatus.

As an example of an electronic apparatus using the light emitting apparatus according to the invention, in addition to the light emitting apparatus shown in FIG. 16, where are personal computers, digital still cameras, TVs, video cameras, car navigation apparatuses, pagers, electronic schedulers, electronic papers, word processors, work stations, video phones, POS terminals, printers, scanners, copiers, video players, apparatus having a touch panel, and the like.

In addition, the use of the light emitting apparatus according to the invention is not limited to image display. For example, the light emitting apparatus according to the embodiment may be used as a backlight of a liquid crystal panel.

What is claimed is:

1. A light emitting apparatus comprising:
   a first unit device including:
      a first resonator structure of a first resonance wavelength, the first resonator structure having:
      a first reflecting layer,
      a first semi-reflecting layer that reflects and transmits light;
      a first light emitting layer disposed between the first reflecting layer and the first semi-reflecting layer, and
      a light transmitting first pixel electrode disposed between the first reflecting layer and the first semi-reflecting layer, the first pixel electrode including a first electrode portion that overlaps the first light emitting layer
      and a first connection portion connected to a first wire line;
   a second unit device including:
      a second resonator structure of a second resonance wavelength different from the first resonance wavelength of the first resonator structure, the second resonator structure having:
      a second reflecting layer,
      a second semi-reflecting layer that reflects and transmits light,
      a second light emitting layer disposed between the second reflecting layer and the second semi-reflecting layer, and
      a light-transmitting second pixel electrode disposed between the second reflecting layer and the second semi-reflecting layer, the second pixel electrode including a second electrode portion that overlaps the second light emitting layer and a second connection portion connected to a second wire line,
   wherein the first electrode portion includes a stack of electrode layers and the second electrode portion includes at least one electrode layer such that a number of electrode layers of the second electrode portion is less than that in the first electrode portion.

2. The light emitting apparatus according to claim 1, further comprising a third unit device including a third resonator structure with a third resonance wavelength different from the first resonance wavelength and the second resonance wavelength, the third resonator structure having:
- a third reflecting layer,
- a third semi-reflecting layer that reflects and transmits light,
- a third light emitting layer disposed between the third reflecting layer and the third semi-reflecting layer, and
- a light-transmitting third pixel electrode including a third electrode portion that overlaps the third light emitting layer, the third electrode portion includes a stack of electrode layers in a number greater than that in the first pixel electrode portion.

3. A method of manufacturing the light emitting apparatus according to claim 2, the method comprising:
- forming the first pixel electrode layer corresponding to the first electrode portion and the first connection portions portion of the first unit device and corresponding to the second connection portion of the second unit device;
- forming the second pixel electrode layer corresponding to the electrode portions and connection portions of the first and second unit devices;
- in the forming of the first pixel electrode forming a pixel electrode layer corresponding to a third connection portion which is different from the electrode portions and the connection portions of the first and second unit devices by using the first pixel electrode;
- in the forming of the second pixel electrode, forming a pixel electrode corresponding to the third connection portion by using the second pixel electrode; and
- after the forming of the second pixel electrode, forming a third pixel electrode corresponding to the electrode portions and connection portions of the first, second, and third unit device.

4. A method of manufacturing the light emitting apparatus according to claim 1, the method comprising:
- forming the first pixel electrode corresponding to the first electrode portion and the first connection portion of the first unit device and corresponding to the second connection portion of the second unit device; and
- forming the second pixel electrode corresponding to the electrode portions and connection portions of the first and second unit devices.

5. The method according to claim 4, further comprising, in the forming of the first pixel electrode, forming the first pixel electrode to cover a step difference portion on a to-be-formed surface on which the first pixel electrode is formed.

6. The method according to claim 5, further comprising forming the second pixel electrode to cover a portion of the first pixel electrode corresponding to the step difference portion.

7. The method according to claim 4, further comprising, before the forming of the electrode portions, forming the light reflecting layer and forming a protective film having a light transmitting property to cover the light reflecting layer.

8. A light emitting apparatus comprising:
a first unit device including:
- a first resonator structure of a first resonance wavelength, the first resonator structure having:
- a first reflecting layer,
- a first semi-reflecting layer that reflects and transmits light;
- a first light emitting layer disposed between the first reflecting layer and the first semi-reflecting layer, and
- a light transmitting first pixel electrode disposed between the first reflecting layer and the first semi-reflecting layer, the first pixel electrode including a first electrode portion that overlaps the first light emitting layer and a first connection portion connected to a first wire line;

a second unit device including:
- a second resonator structure of a second resonance wavelength different from the first resonance wavelength of the first resonator structure, the second resonator structure having:
- a second reflecting layer,
- a second semi-reflecting layer that reflects and transmits light,
- a second light emitting layer disposed between the second reflecting layer and the second semi-reflecting layer, and
- a light-transmitting second pixel electrode disposed between the second reflecting layer and the second semi-reflecting layer, the second pixel electrode including a second electrode portion that overlaps the second light emitting layer and a second connection portion connected to a second wire line,
wherein the first electrode portion includes a stack of electrode layers and the second electrode portion includes at least one electrode layer such that a number of electrode layers of the second electrode portion is less than that in the first electrode portion, the first connection portion and the second connection portion includes the same number of electrode layers.

9. The light emitting apparatus according to claim 8, further comprising a third unit device including a third resonator structure with a third resonance wavelength different from the first resonance wavelength and the second resonance wavelength, the third resonator structure having:
- a third reflecting layer,
- a third semi-reflecting layer that reflects and transmits light,
- a third light emitting layer disposed between the third reflecting layer and the third semi-reflecting layer, and
- a light-transmitting third pixel electrode including a third electrode portion that overlaps the third light emitting layer, the third electrode portion includes a stack of electrode layers in a number greater than that in the first pixel electrode portion.

10. A light emitting apparatus comprising:
a protective film having a light transmitting property,
a first unit device including:
- a first resonator structure of a first resonance wavelength, the first resonator structure having:
- a first reflecting layer,
- a first semi-reflecting layer that reflects and transmits light;
- a first light emitting layer disposed between the first reflecting layer and the first semi-reflecting layer, and
- a light transmitting first pixel electrode disposed between the first reflecting layer and the first semi-reflecting layer, the first pixel electrode including a first electrode portion that overlaps the first light emitting layer;
a second unit device including:
- a second resonator structure of a second resonance wavelength different from the first resonance wavelength of the first resonator structure, the second resonator structure having:
- a second reflecting layer, a second semi-reflecting layer that reflects and transmits light, a second light emitting layer disposed between the second reflecting layer and the second semi-reflecting layer, and a light transmitting second pixel electrode disposed between the second reflecting layer and the second semi-reflecting layer, the second pixel electrode including a second electrode portion that overlaps the second light emitting layer, wherein the first electrode portion includes a stack of electrode layers and the second electrode portion includes at least one electrode layer such that a number of electrode layers of the second electrode portion is less than that in the first electrode portion and the protective film is interposed between the first light reflecting layer and the first pixel electrode and covering the first reflecting layer.

11. The light emitting apparatus according to claim 10, further comprising a third unit device including a third resonator structure with a third resonance wavelength different from the first resonance wavelength and the second resonance wavelength, the third resonator structure having:

a third reflecting layer, a third semi-reflecting layer, a third light emitting layer disposed between the third reflecting layer and the third semi-reflecting layer, and a light-transmitting third pixel electrode with a stack of electrode layers in a number greater than in the stack of electrode layers in the first pixel electrode.

12. A light emitting apparatus comprising:

a first unit device including:

a first resonator structure of a first resonance wavelength, the first resonator structure having:

a first reflecting layer, a first semi-reflecting layer that reflects and transmits light;

a first light emitting layer disposed between the first reflecting layer and the first semi-reflecting layer, and a first pixel electrode disposed between the first reflecting layer and the first semi-reflecting layer, the first pixel electrode including a first electrode portion that overlaps the first light emitting layer and a first connection portion connected to a first wire line; and a second unit device including:

a second resonator structure of a second resonance wavelength different from the first resonance wavelength of the first resonator structure, the second resonator structure having:

a second reflecting layer, a second semi-reflecting layer that reflects and transmits light, a second light emitting layer disposed between the second reflecting layer and the second semi-reflecting layer, and a second pixel electrode disposed between the second reflecting layer and the second semi-reflecting layer, the second pixel electrode including a second electrode portion that overlaps the second light emitting layer and a second connection portion connected to a second wire line, wherein the first electrode portion of the first pixel electrode is thicker than the second electrode portion of the second pixel electrode, and a thickness of the second connection of the second pixel electrode is the same as that of the first connection portion of the first pixel electrode.

13. The light emitting apparatus according to claim 12, further comprising:

a third unit device including a third resonator structure with a third resonance wavelength different from the first resonance wavelength and the second resonance wavelength, the third resonator structure having:

a third reflecting layer, a third semi-reflecting layer that reflects and transmits light, a third light emitting layer disposed between the third reflecting layer and the third semi-reflecting layer, and a third pixel electrode disposed between the third reflecting layer and the third semi-reflecting layer, the third pixel electrode including a third electrode portion that overlaps the third light emitting layer and a second connection portion connected to a third wire line, wherein the third electrode portion of the third pixel electrode is thicker than the second electrode portion of the second pixel electrode and is thinner than the first electrode portion of the first pixel electrode, and a thickness of the third connection portion of the third pixel electrode is the same as that of the first connection portion of the first pixel electrode.

14. The light emitting apparatus according to claim 12, the thickness of the second connection portion of the second pixel electrode is the same as that of the first electrode portion of the first pixel electrode.

* * * * *